US010295587B2

(12) United States Patent
Djeddi (10) Patent No.: US 10,295,587 B2
(45) Date of Patent: May 21, 2019

(54) METHOD AND DEVICE FOR DETECTING ARCING IN ELECTRICAL INSTALLATION FOR DC POWER

(71) Applicant: Schneider Electric Industries SAS, Rueil Malmaison (FR)

(72) Inventor: Mounir Djeddi, Echirolles (FR)

(73) Assignee: SCHNEIDER ELECTRIC INDUSTRIES SAS, Rueil Malmaison (FR)

(*) Notice: Subject to any disclaimer, the term of this patent is extended or adjusted under 35 U.S.C. 154(b) by 678 days.

(21) Appl. No.: 14/789,183

(22) Filed: Jul. 1, 2015

(65) Prior Publication Data

US 2016/0003886 A1    Jan. 7, 2016

(30) Foreign Application Priority Data

Jul. 4, 2014    (FR) .................................... 14 56477

(51) Int. Cl.
*H02H 3/00*        (2006.01)
*G01R 31/08*       (2006.01)
*G01R 31/12*       (2006.01)
*H02H 1/00*        (2006.01)
*H02S 50/00*       (2014.01)
*G01R 31/14*       (2006.01)
(Continued)

(52) U.S. Cl.
CPC ....... *G01R 31/088* (2013.01); *G01R 31/1272* (2013.01); *G01R 31/14* (2013.01); *H02H 1/0015* (2013.01); *H02S 50/00* (2013.01); *G01R 31/40* (2013.01); *H02H 7/20* (2013.01)

(58) Field of Classification Search
None
See application file for complete search history.

(56) References Cited

U.S. PATENT DOCUMENTS 6,191,589 B1* 2/2001 Clunn .................. G01R 15/183
                                              324/127
6,426,632 B1* 7/2002 Clunn .................. G01R 15/183
                                              324/424
(Continued)

FOREIGN PATENT DOCUMENTS

FR        2 983 968 A1    6/2013

OTHER PUBLICATIONS

French Preliminary Search Report dated Sep. 17, 2014 in French Application 14 56477, filed on Jul. 4, 2014 (with English Translation of Categories of Cited Documents).
(Continued)

*Primary Examiner* — Ali Naraghi
(74) *Attorney, Agent, or Firm* — Oblon, McClelland, Maier & Neustadt, L.L.P.

(57) ABSTRACT

A method for detecting electrical arcs for electrical installations with DC current source, implemented by a detection device including a calculation processor, disposed between the DC current source and a load. A digitized temporal signal is obtained on the basis of the electric current provided by the DC current source. A digitized temporal sub-signal is extracted. A bandpass filtering is applied to the digitized temporal sub-signal. The method also includes calculating a statistical value of order four of the filtered digitized temporal sub-signal, and comparing the calculated statistical value of order four with a first statistical threshold.

13 Claims, 3 Drawing Sheets

(51) Int. Cl.
*H02H 7/20* (2006.01)
*G01R 31/40* (2014.01)

(56) References Cited

U.S. PATENT DOCUMENTS

| | | |
|---|---|---|
| 2006/0203401 A1* | 9/2006 | Kojori .................. H02H 1/0015 361/42 |
| 2012/0134058 A1 | 5/2012 | Pamer et al. |
| 2014/0301008 A1 | 10/2014 | Gouy-Pailler et al. |

OTHER PUBLICATIONS

Xiu Yao et al. "The Detection of DC Arc Fault: Experimental Study and Fault Recognition", Applied Power Electronics Conference and Exposition (APEC), 2012 Twenty-Seventh Annual IEEE, Feb. 5, 2012, 8 pages.

* cited by examiner

METHOD AND DEVICE FOR DETECTING ARCING IN ELECTRICAL INSTALLATION FOR DC POWER

The present invention relates to a method and device for detecting electrical arcs for electrical installations with DC current source.

It appertains to the field of the protection of electrical installations.

The invention finds a particular application in the field of photovoltaic installations, comprising photovoltaic panels as DC electrical energy sources. In photovoltaic installations, an inverter device able to transform DC electric current into AC current to be injected into the electrical distribution network is connected to the photovoltaic panels.

Generally, the invention applies in respect of any other type of electrical installation comprising one or more DC electric current sources wired up to a load, especially when the connection cable between current sources and loads is long.

In such installations, insulation defects may be noted over the length of the connection cable. Electrical arcs can then occur, giving rise to a fire risk and a safety risk in respect of maintenance workers. Moreover, the loads wired up downstream also run the risk of being damaged, thus giving rise to repair and replacement costs.

The problems related to the occurrence of electrical arcs are well known, and there exist diverse procedures for detecting presence of an electrical arc as early as possible, so as to effect a cutoff of the electrical circuit and to avoid the occurrence of fire, accident to maintenance workers and damage to the loads.

In the field of DC current sources of photovoltaic installations, it is particularly difficult to apply certain known procedures, on account of the presence of resistive loads and of the resistance of the very lengthy connection cable. In certain typical cases the arc current is low and it has been observed by simulation that the spectrum of the current in case of presence of arc is very close to the spectrum of the current in the absence of arc, thus rendering electrical arc detection very difficult.

The objective of the invention is to propose an electrical arc detection procedure for electrical installations with DC current source, which is effective even in cases where the electrical arc current is low.

For this purpose, the invention proposes, according to a first aspect, a method for detecting electrical arcs for electrical installations with DC current source, implemented by a detection device comprising a calculation processor, disposed between the DC current source and a load.

The method of the invention comprises steps of:
obtaining of a digitized temporal signal on the basis of the electric current provided by the DC current source,
for a plurality of successive time windows of predetermined temporal duration:
  extraction of a digitized temporal sub-signal of said digitized temporal signal corresponding to a current time window,
  application of a bandpass filtering to said digitized temporal sub-signal,
  calculation of a statistical value of order four of the filtered digitized temporal sub-signal,
  comparison of the calculated statistical value of order four with a first statistical threshold and/or with a second statistical threshold, and in the case where the statistical value of order four is less than the first statistical threshold, or in the case where the statistical value of order four is greater than the second statistical threshold, storage of a positive detection indication in respect of the current time window,
  detection of presence of electrical arc when the number of stored indications of positive detection exceeds a predetermined detection threshold.

Advantageously, the electrical arc detection method according to the invention comprises the extraction of temporal sub-signals and the analysis of fourth-order statistics in several time windows so as to detect the presence of electrical arc.

The method according to the invention is effective even when the arc current is low, and it is fast from a calculational point of view.

The method for detecting electrical arcs according to the invention can also exhibit one or more of the characteristics hereinbelow.

This method comprises, for a said digitized temporal sub-signal corresponding to a current time window, a determination of a value of envelope maximum of the digitized temporal sub-signal, and an updating of said positive detection indication as a function of the calculated statistical value of order four and of the calculated value of envelope maximum.

The determination of a value of envelope maximum of the digitized temporal sub-signal is performed when said statistical value of order four is greater than the first statistical threshold and less than the second statistical threshold.

The method furthermore comprises, when the statistical value of order four is greater than the first statistical threshold and less than an intermediate statistical threshold, a comparison of the value of envelope maximum with a first envelope threshold, and a detection of presence of electrical arc if value of envelope maximum is greater than said first envelope threshold.

When the statistical value of order four is greater than the intermediate statistical threshold and less than the second statistical threshold, the method comprises a comparison of the value of envelope maximum with a second envelope threshold, and a detection of presence of electrical arc if value of envelope maximum is greater than said second envelope threshold.

The method comprises a calculation of a coefficient of variation dependent on the mean and the statistical value of order two of the digitized temporal sub-signal corresponding to the current time window before bandpass filtering, and an updating of said positive detection indication when said coefficient of variation exceeds a predetermined variation threshold.

For each current time window, the storage of an electrical arc detection indication in a circular buffer memory of predetermined size is implemented.

According to a characteristic, the detection threshold is calculated as a function of the size of the circular buffer memory.

According to a characteristic, two successive time windows exhibit an overlap of a predetermined duration of overlap.

The bandpass filtering is defined by a first frequency F1 and a second frequency F2, said first frequency being dependent on a cutoff frequency of said load, said second frequency being dependent on a sampling frequency of an analog-digital converter making it possible to obtain said digitized temporal signal.

According to a second aspect, the invention relates to a device for detecting electrical arcs for electrical installations with DC current source, comprising a calculation processor, disposed between the DC current source and a load.

The device comprises:
- a module for obtaining a digitized temporal signal on the basis of the electric current provided by the DC current source,
- for application to for a plurality of successive time windows of predetermined temporal duration,
- a unit for extracting a digitized temporal sub-signal of said digitized temporal signal corresponding to a current time window,
- a bandpass filtering module to said digitized temporal sub-signal,
- a module for calculating a statistical value of order four of the filtered digitized temporal sub-signal,
- a decision module, able to perform a comparison of the calculated statistical value of order four with a first statistical threshold and/or with a second statistical threshold, and in the case where the statistical value of order four is less than the first statistical threshold, or in the case where the statistical value of order four is greater than the second statistical threshold, a storage of a positive detection indication in respect of the current time window,
- the decision module being able to detect presence of electrical arc when the number of stored indications of positive detection exceeds a predetermined detection threshold.

The device for detecting electrical arcs according to the invention can also exhibit one or more of the characteristics hereinbelow.

It comprises a module for triggering a safety unit in response to a triggering signal dispatched by the decision module.

The unit for extracting a digitized temporal sub-signal of said digitized temporal signal corresponding to a current time window comprises an electric current sensor and an analog-digital converter having a given sampling frequency.

The bandpass filtering module is the bandpass filtering is able to perform a filtering between a first frequency F1 and a second frequency F2, said first frequency being dependent on a cutoff frequency of said load, said second frequency being dependent on the sampling frequency.

It comprises a module for calculating the envelope of said digitized temporal sub-signal corresponding to a current time window, a value of envelope maximum of the digitized temporal sub-signal being transmitted to said decision module.

It comprises a variation calculation module able to calculate a coefficient of variation dependent on the mean and the statistical value of order two of the digitized temporal sub-signal corresponding to the current time window before bandpass filtering, and to transmit the calculated coefficient of variation to said decision module.

Other characteristics and advantages of the invention will emerge from the description which is given thereof hereinbelow, by way of wholly nonlimiting indication, with reference to the appended figures, among which.

Figure 1:
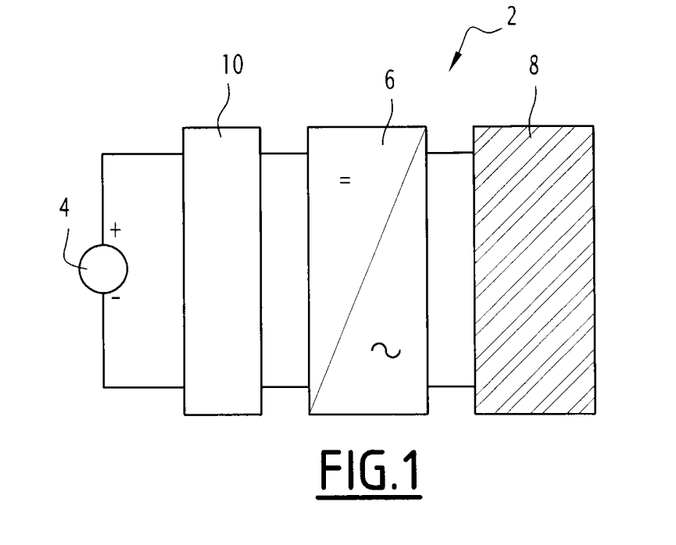
FIG. 1 schematically represents an electrical installation comprising a device for detecting presence of electrical arcs according to an embodiment of the invention.

FIG. 1 schematically illustrates an electrical installation 2 in which the invention finds an application.

The embodiment illustrated entails a photovoltaic electrical installation 2, comprising a DC current source 4, formed for example of a set of solar panels, connected in the circuit of the electrical installation 2 to an inverter 6.

The inverter 6 is able to transform the DC electric current provided by the source 4 into AC electric current of frequency 50 Hz, making it possible to supply an electrical network 8.

Figure 2:
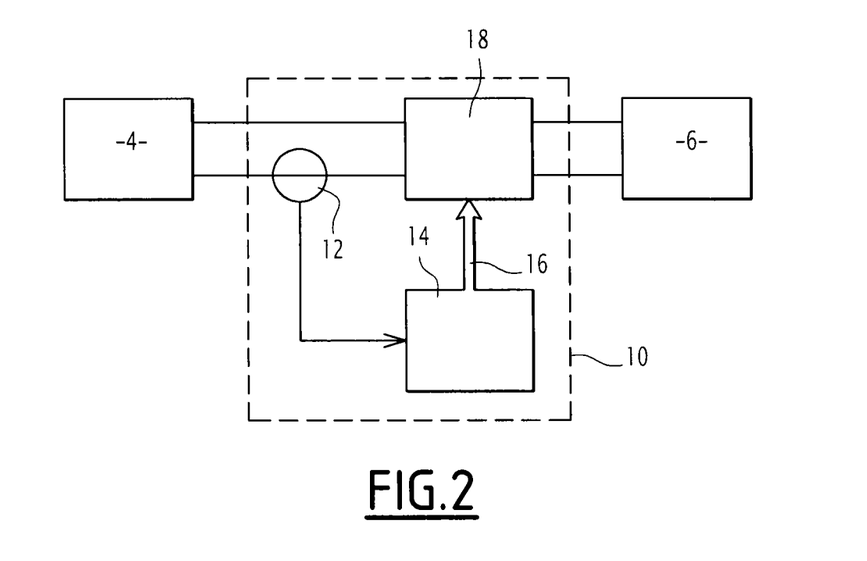
FIG. 2 schematically represents a set of functional blocks of a device for detecting electrical arcs according to an embodiment of the invention.

The circuit of the installation 2 also comprises a device for detecting presence of electrical arcs 10, whose main functional blocks are described in greater detail with reference to FIG. 2.

The device for detecting presence of electrical arcs 10 comprises an electric current sensor 12 which is able to recover the signal corresponding to the DC electric current, and to digitize it to provide a digitized temporal signal as input to a calculation device 14 able to perform digital signal processings.

The calculation device 14 is for example a microcontroller or a digital signal processor (DSP). The device 14 comprises especially a microprocessor, memories and input-output interfaces 16 making it possible to dispatch control orders to a safety unit 18, able to open the circuit so as to eliminate the propagation of detected electrical arc.

Figure 3:
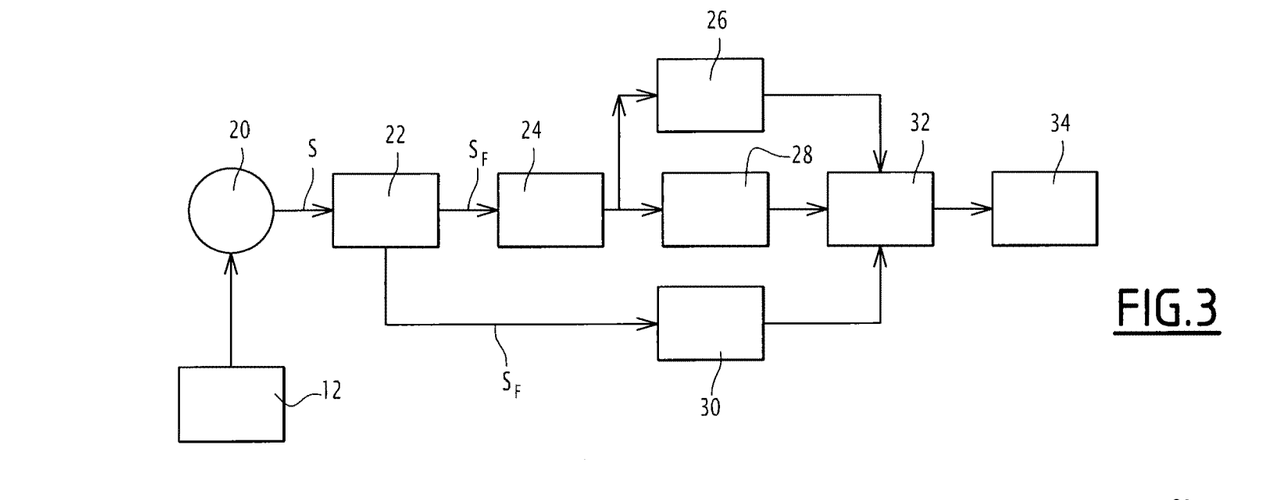
FIG. 3 illustrates functional modules implemented by a calculation device of a device for detecting electrical arcs according to the invention.

The device 14 is programmed to implement functional decision modules such as illustrated schematically in FIG. 3.

As illustrated in FIG. 3, the DC electric current sensor 12 recovers the corresponding signal, and the analog-digital conversion unit 20 provides a digitized temporal signal S which is stored in tandem with its acquisition, preferably in a buffer memory (or buffer) of the digital samples.

A unit 22 for extracting a digitized temporal sub-signal corresponding to a sliding time window, defined between a temporal instant $T_0$ and a temporal instant $T_0+\Delta t$, is applied so as to extract a digitized temporal sub-signal $S_F$. For example, $\Delta t=0.2$ seconds, thus corresponding to K samples of the digital signal.

The extraction unit 22 is applied successively by applying the sliding window, two successive extractions preferably having an overlap zone of dt seconds corresponding to r samples.

For example, the overlap zone is equal to $dt=0.5\times\Delta t$. In a more general manner, dt lies between $0.1\times\Delta t$ and $0.9\times\Delta t$.

Figure 4:
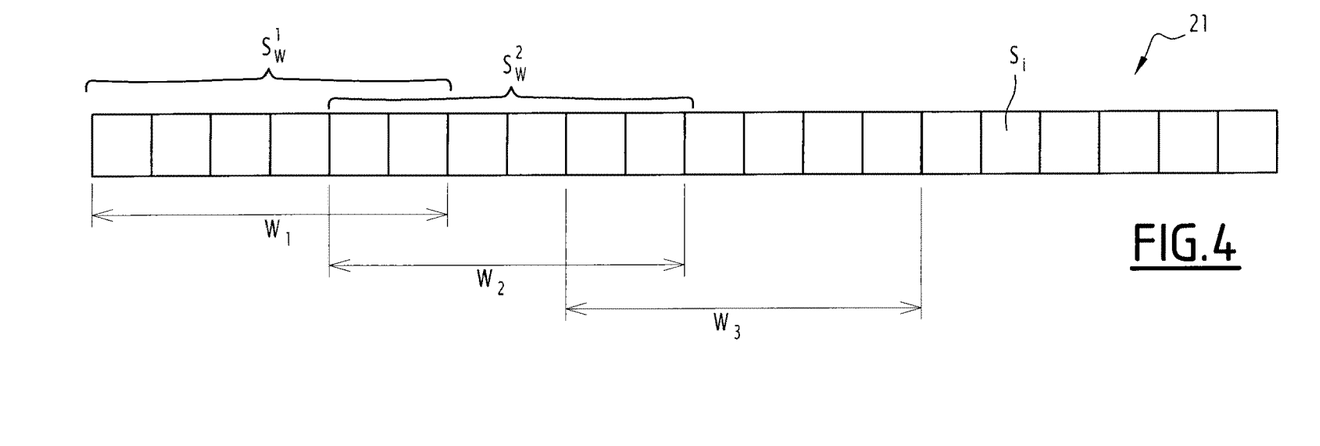
FIG. 4 schematically illustrates samples of digitized temporal sub-signals.

In FIG. 4, the samples $S_i$ of the digitized temporal signal are stored in the memory 21, and digitized temporal sub-signals $Sw_1$, $Sw_2$ and so on and so forth are extracted from the buffer memory 21, for time windows $W_1$, $W_2$ with an overlap of r=2 samples in this example.

The digitized temporal sub-signals are thereafter processed by the respective processing modules 24 and 26 to 28.

The filtering module 24 applies a bandpass filtering, between a first frequency F1 and a second frequency F2, for example F1=50 kHz (kilo-Hertz) and F2=90 kHz.

Other values of first frequency and second frequency can be selected for the definition of the bandpass filtering.

More generally, the first frequency is chosen as a function of the cutoff frequency of the load 6, and the second frequency is chosen as a function of the sampling frequency of the analog-digital conversion applied to the temporal signal representative of the electric current. For example, for a sampling at 200 kHz, a second frequency of 90 kHz is selected.

In a first embodiment, the filtering module 24 is implemented by the calculation device 14 such as described hereinabove.

In an alternative embodiment, the filtering module 24 is implemented by an analog filtering circuit.

A filtered digitized temporal sub-signal is obtained as output from the filtering module 24.

The statistical calculation module 26 performs a calculation of a statistical value of order 4 or kurtosis, also called the flattening coefficient, of each filtered digitized temporal sub-signal, and the envelope calculation module 28 performs the calculation of the maximum of the envelope of each filtered digitized temporal sub-signal, as explained in greater detail hereinafter.

The variation calculation module 30 performs a calculation of coefficient of variation of the temporal sub-signal before bandpass filtering, for each digitized temporal sub-signal extracted by the extraction unit 22.

In one embodiment, the statistical calculation module 26, envelope calculation module 28 and variation calculation module 30 are implemented substantially in parallel. Each of the calculation modules provides an electrical arc presence detection indicator, if appropriate, for each digitized temporal sub-signal corresponding to a time window, to a decision module 32.

In an alternative embodiment, the statistical calculation module 26 is applied initially, and the envelope calculation module 28 and variation calculation module 30 are applied subsequently, as a function of the result of the statistical calculation module 26.

The decision module 32 stores arc presence detection indications for a plurality of digitized temporal sub-signals each corresponding to a time window, and performs a determination of electrical arc detection as a function of the plurality of the arc detection indications.

In one embodiment, the arc detection indications are represented in the form of flags taking a binary value indicating respectively the detection of presence or of absence of electrical arc for a digitized temporal sub-signal corresponding to a given time window, and are stored in an arc detection buffer memory, of circular type and of given capacity N.

The decision module 32 decides presence of an electrical arc when the arc detection buffer memory contains at least n positive indications among the N stored indications.

Preferably, n lies between 30% of N and 100% of N.

In case of positive decision by the decision module 32, this module dispatches a triggering signal to a module 34 for triggering the safety unit 18, so as to open the electrical circuit.

Figure 5:
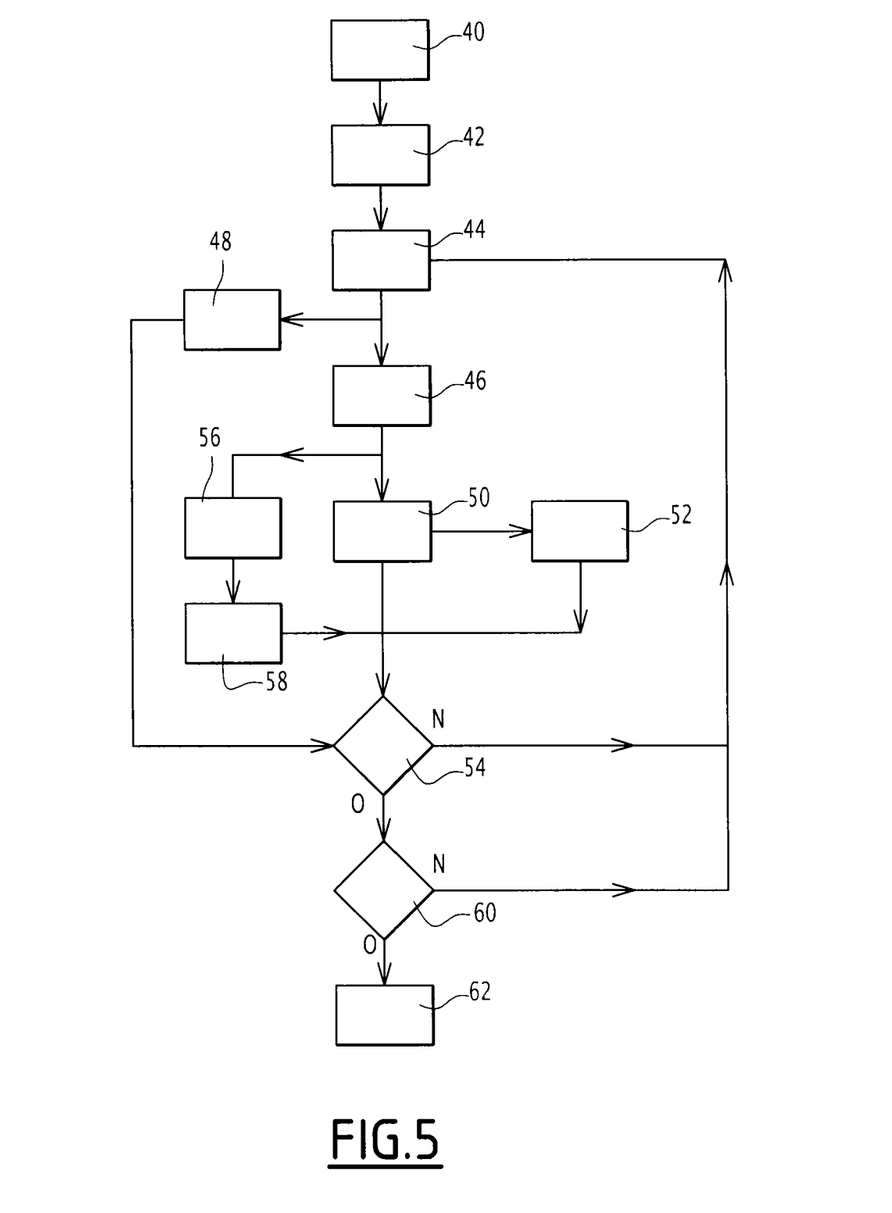
FIG. 5 is a schematic of the main steps of a method for detecting electrical arcs according to an embodiment of the invention.

FIG. 5 is a schematic of the main steps of a method for detecting electrical arcs for electrical installations with DC current source according to an embodiment of the invention.

In a first step 40 of electrical signal acquisition, the temporal signal representative of the DC electric current arising from the DC current source is acquired.

This temporal signal is digitized by an analog-digital converter during the digitization step 42, and the samples of digitized temporal signal which are obtained are stored in a buffer memory of the digital samples. In an exemplary embodiment, a digitization at 200 kHz is performed.

A digitized temporal sub-signal is extracted during the sub-signal extraction step 44, for a current time window lying between a given initial instant $T_0$ and a given final instant $T_0+\Delta t$.

The digitized temporal signal is filtered during a bandpass filtering step 46, for example by a Butterworth filter of order 6 between a first frequency of 50 kHz and a second frequency of 90 kHz.

The set of digital samples of the extracted digitized temporal sub-signal is also provided as input to a coefficient of variation calculation step 48.

For a digitized temporal sub-signal Sw composed of samples $S_W(1)$ to $S_W(K)$, the coefficient of variation $C_v(S_W)$ is given by:

$$C_v(S_W) = 100 \times \frac{\mu(S_W)}{\sigma(S_W)} \tag{Eq 1}$$

Where $\mu(S_W)$ is the mean of the digitized temporal sub-signal $S_W$, or first-order statistic:

$$\mu(S_W) = E[S_W] = \frac{1}{K}\sum_{i=1}^{K} S_W(i) \tag{Eq 2}$$

E[X] denoting the mathematical expectation of a variable X.

And $\sigma(S_W)$ is the standard deviation of the digitized temporal sub-signal $S_W$, or second-order statistic:

$$\sigma(S_W) = \sqrt{E[(S_W - \mu(S_W))^2]} = \sqrt{\frac{1}{K}\sum_{i=1}^{K}(S_W(i) - \mu(S_W))^2} \tag{Eq 3}$$

After filtering of the digitized temporal sub-signal during the bandpass filtering step 46, the mean and the variance of the filtered digitized temporal sub-signal $S_{WF}$ are calculated in step 50 of calculating the statistics of order 1 and 2 after filtering:

$$\mu(S_{WF}) = E[S_{WF}] = \frac{1}{K}\sum_{i=1}^{K} S_{WF}(i) \tag{Eq 4}$$

$$\sigma^2(S_{WF}) = E[(S_{WF} - \mu(S_{WF}))^2] \tag{Eq 5}$$

The statistical value of order 4 or kurtosis of the filtered digitized temporal sub-signal $S_{WF}$ is calculated during the higher-order statistic calculation step 52, performed after the calculation of the statistics of order 1 and 2.

The kurtosis is defined, for a filtered digitized temporal sub-signal $S_{WF}$, by:

$$K(S_{WF}) = \frac{E[(S_{WF} - \mu(S_{WF}))^4]}{\sigma^4(S_{WF})} \tag{Eq 6}$$

For a given filtered digitized temporal sub-signal $S_{WF}$, a kurtosis value is thus obtained. When the distribution of the samples of the filtered digitized temporal sub-signal $S_{WF}$ is a normalized Gaussian, the kurtosis value is K=3.

The kurtosis value obtained for a filtered digitized temporal sub-signal $S_{WF}$ is provided to a detection step 54 for a given time window.

The detection step 54 implements arc detection tests each providing an electrical arc presence or absence detection indicator, for the digitized temporal sub-signal corresponding to the current time window.

It has been noted, following experimental tests performed by the inventors, that when the value of the kurtosis $K(S_{WF})$ calculated for a given filtered digitized temporal sub-signal $S_{WF}$ is less than a first statistical threshold $K_1$, or is greater than a second statistical threshold $K_2$, the detection of presence of electrical arc is positive.

Preferably, the first statistical threshold is $K_1=2.1$ and the second statistical threshold is $K_2=5$.

Generally $K_1=2.1 \pm \Delta K_1$ and $K_2=5 \pm \Delta K_2$ here $\Delta K_1$ and $\Delta K_2$ are defined in such a way that the detection of the arc is always optimal, with $\Delta K_1=0.1$ and $\Delta K_2=0.1$.

A first test performed in the detection step 54 consists in comparing the calculated value of the kurtosis $K(S_{WF})$ with the first threshold $K_1$ and with the second threshold $K_2$.

If the first test indicates that $K(S_{WF}) \leq K_1$ or that $K(S_{WF}) \geq K_2$, a first binary indicator $Ind_1$ is then set to 1.

More generally, a first indicator $Ind_1$ is set to a value indicating a positive electrical arc detection in respect of the digitized temporal sub-signal $S_W$ considered.

The method also comprises a step 56 of calculating an envelope signal of the digitized temporal sub-signal $S_W$ considered and a step 58 of calculating the maximum of the envelope of this sub-signal.

Step 56 is performed substantially in parallel with the higher-order statistic calculation step 52 or after the higher-order statistic calculation step 52.

It comprises the calculation of an envelope signal on the basis of the filtered digitized temporal sub-signal $S_{WF}$:

$$Y(n) = S_{WF}(i) + j \cdot H(S_{WF}(i)) \qquad \text{(Eq 7)}$$

Where j is the unit of the imaginary domain and H(X) is the Hilbert transform of a signal X.

Thereafter, during step 58, the maximum in terms of absolute value of the analytical signal Y(i) is calculated.

The envelope maximum, denoted $MaxEnv(S_{WF})$, is calculated as follows:

$$MaxEnv(S_{WF}) = MAX(|Y(i)|) \qquad \text{(Eq 8)}$$

Where MAX(•) is the maximum function and |Y(i)| is the absolute value of the amplitude of the signal Y(i).

The envelope maximum value obtained is also provided to the detection step 54.

In the detection step 54, the value of envelope maximum $MaxEnv(S_{WF})$ is used with the kurtosis value $K(S_{WF})$ calculated for the current filtered digitized temporal sub-signal to perform a second test of detection of presence of electrical arc.

If the value of K(Swf) lies between the first statistical threshold $K_1$ and an intermediate statistical threshold value $K_{int}$ and if the value of the maximum of envelope of the sub-signal MaxEnv(Swf) is greater than a first envelope threshold $ME_1$, then a second indicator Ind2 is set to a value indicating a positive electrical arc detection in respect of the digitized temporal sub-signal Sw considered.

Preferably Kint=3.3 and ME1=0.3.

If the value of K(Swf) lies between the intermediary statistical threshold value $K_{int}$ and the second statistical threshold $K_2$, and if the value of the maximum of envelope MaxEnv(Swf) is greater than a second envelope threshold $ME_2$, then the second indicator Ind2 is set to a value indicating a positive electrical arc detection in respect of the digitized temporal sub-signal Sw considered.

Preferably $K_{int}=3.3$ and $ME_2=0.03$.

It will be also noted that K2>K1.

Finally, in the detection step 54, the value of the coefficient of variation calculated during the coefficient of variation calculation step 48 is used to perform a third test of detection of presence of electrical arc.

The calculated value of the coefficient of variation is compared with a variation threshold value V, for example equal to 15, and preferably lying between 15% and 100%.

In case of exceeding of the variation threshold, therefore if $C_v(S_W) > V$, then a third indicator $Ind_3$ is set to a value indicating a positive electrical arc detection in respect of the sub-signal $S_{WF}$ considered.

Lastly, during the detection step 54, several calculated values for the digitized temporal sub-signal corresponding to the current time window are compared with thresholds, and three electrical arc presence detection indicators are updated.

The three indicators make it possible to provide an electrical arc detection indication, positive or negative, in respect of the current time window.

If one of the three updated indicators $Ind_1$, $Ind_2$ and $Ind_3$ is positive, therefore indicates a positive detection of presence of electrical arc, then the electrical arc detection indication in respect of the current time window is positive.

If all three indicators $Ind_1$, $Ind_2$ and $Ind_3$ are negative, then the electrical arc detection indication in respect of the current time window is negative.

If the electrical arc detection indication in respect of the current time window is positive, then the detection step 54 is followed by the step 60 of deciding presence of arc as a function of the tests performed for a plurality of extracted digitized temporal sub-signals.

According to one embodiment, the electrical arc detection indication in respect of the current time window is updated in a circular buffer memory, called the arc detection buffer memory, making it possible to store results of the detection tests for a predetermined number N of digitized temporal sub-signals, extracted successively using a temporally sliding time window of predetermined duration $\Delta T$.

In practice, the positive electrical arc detection indication in respect of the current time window is carried out by setting a corresponding bit in the arc detection buffer memory to 1, whereas a negative detection indication is manifested by setting the corresponding bit to 0.

For example, the size N of the arc detection buffer memory is given by the formula:

$$N = \left\| \frac{f_s}{\Delta T - dt} \right\| \qquad \text{(Eq 9)}$$

Where $\|x\|$ is the numerical rounding of the value x, $f_s$ is the sampling frequency, $\Delta T$ is the duration of time window and dt the duration of overlap between two successive time windows.

It is determined, during the arc presence decision step 60, whether the number n of indications of positive detection per digitized temporal sub-signal is greater than or equal to a detection threshold calculated as a function of N, for example 0.3×N.

Generally, a coefficient P representative of a rate of indications of positive detections among the last N arc presence detections performed is used and it is verified whether $n \geq P \times N$.

In practice, when the electrical arc detection indication is a bit equal to 1, it suffices to sum the set of values stored in the arc detection buffer memory to calculate the value n.

When the decision is positive, a signal for triggering the safety unit is dispatched in the safety triggering step 62, to open the circuit.

In case of negative decision, step 60, as well as the detection step 54 in case of negative detection in respect of the set of tests performed, is followed by step 44 of extracting samples of a digitized temporal sub-signal for a new current time window, lying between $T_0+dt$ and $T_0+dt+\Delta T$.

As a variant, just the first detection test based on the order-four statistic calculated for each extracted digitized temporal sub-signal is used. This variant is faster from a calculational point of view.

In another variant, step 48 is performed only if the kurtosis value calculated for a digitized temporal sub-signal considered lies between the first threshold $K_1$ and the second threshold $K_2$. Thereafter, steps 56 and 58 are performed only if the kurtosis value calculated for a filtered digitized temporal sub-signal considered lies between the first threshold $K_1$ and the second threshold $K_2$ and if the value of the coefficient of variation is less than the variation threshold. In this variant, the first, second and third detection tests are not all performed systematically, they are performed separately and conditionally upon the result of a previous test. There is a saving in time and calculational resources in this variant embodiment.

In the case where the three arc presence detection tests are performed, it is possible to detect several types of electrical arcs, by monitoring diverse characteristics of the electrical signal.

The invention claimed is:

1. A method for detecting electrical arcs for photovoltaic installations with a DC current source, implemented by a detection device comprising a calculation processor, disposed between the DC current source and a load, the method comprising:
   obtaining a digitized temporal signal based on an electric current provided by the DC current source,
   for a plurality of successive time windows of predetermined temporal duration:
      extracting a digitized temporal sub-signal of said digitized temporal signal corresponding to a current time window,
      applying a bandpass filtering to said digitized temporal sub-signal,
      calculating a statistical value of order four of the filtered digitized temporal sub-signal,
      comparing the calculated statistical value of order four with a first statistical threshold and/or with a second statistical threshold, and in the case where the statistical value of order four is less than the first statistical threshold, or in the case where the statistical value of order four is greater than the second statistical threshold, storing a positive detection indication in respect of the current time window,
   detecting presence of electrical arc when a number of stored indications of positive detection exceeds a predetermined detection threshold,
   triggering a safety device to interrupt supply of the electric current provided by the DC current source in response to detection of the presence of the electrical arc, and
   calculating a coefficient of variation dependent on the mean and the statistical value of order two of the digitized temporal sub-signal corresponding to the current time window before bandpass filtering, and updating said positive detection indication when said coefficient of variation exceeds a predetermined variation threshold.

2. The method for detecting electrical arcs as claimed in claim 1, comprising, for a said digitized temporal sub-signal corresponding to a current time window, determining a value of envelope maximum of the digitized temporal sub-signal, and updating said positive detection indication as a function of the calculated statistical value of order four and of the determined value of envelope maximum.

3. The method for detecting electrical arcs as claimed in claim 2, wherein determining a value of envelope maximum of the digitized temporal sub-signal is performed when said statistical value of order four is greater than the first statistical threshold and less than the second statistical threshold.

4. The method for detecting electrical arcs as claimed in claim 2, comprising:
   when the statistical value of order four is greater than the first statistical threshold and less than an intermediate statistical threshold, comparing the value of envelope maximum with a first envelope threshold, and detecting presence of electrical arc if value of envelope maximum is greater than said first envelope threshold.

5. The method for detecting electrical arcs as claimed in claim 4, comprising:
   when the statistical value of order four is greater than the intermediate statistical threshold and less than the second statistical threshold, comparing the value of envelope maximum with a second envelope threshold, and detecting presence of electrical arc if value of envelope maximum is greater than said second envelope threshold.

6. The method for detecting electrical arcs as claimed in claim 1, comprising, for each current time window, storing an electrical arc detection indication in a circular buffer memory of predetermined size.

7. The method for detecting electrical arcs as claimed in claim 6, wherein said detection threshold is calculated as a function of a size of the circular buffer memory.

8. The method for detecting electrical arcs as claimed in claim 1, wherein two successive time windows exhibit an overlap of a predetermined duration of overlap.

9. The method for detecting electrical arcs as claimed in claim 1, wherein the bandpass filtering is defined by a first frequency and a second frequency, said first frequency being dependent on a cutoff frequency of said load, said second frequency being dependent on a sampling frequency of an analog-digital converter to obtain said digitized temporal signal.

10. A device for detecting electrical arcs for photovoltaic installations with DC current source, comprising:
   a calculation processor, disposed between the DC current source and a load, the calculation processor being configured to
   obtain a digitized temporal signal based on an electric current provided by the DC current source,
   for application to a plurality of successive time windows of predetermined temporal duration,
      extract a digitized temporal sub-signal of said digitized temporal signal corresponding to a current time window,
      bandpass filter said digitized temporal sub-signal,
      calculate a statistical value of order four of the filtered digitized temporal sub-signal, perform a comparison of the calculated statistical value of order four with a first statistical threshold and/or with a second statistical threshold, and where the statistical value of order four is less than the first statistical threshold, or where the statistical value of order four is greater than the second statistical threshold, store a positive detection indication in respect of the current time window, detect a presence of an electrical arc when a number of stored indications of positive detection exceeds a predetermined detection threshold, and trigger a safety device to interrupt supply of the electric current provided by the DC current source in response to detection of the presence of the electrical arc, wherein the calculation processor is further configured to calculate a coefficient of variation dependent on a mean and the statistical value of order two of the digitized temporal sub-signal corresponding to the current time window before bandpass filtering.

11. The device for detecting electrical arcs as claimed in claim 10, wherein the calculation processor extracts said digitized temporal signal corresponding to a current time window in conjunction with an electric current sensor and an analog-digital converter having a given sampling frequency.

12. The device for detecting electrical arcs as claimed in claim 11, wherein the calculation processor is further configured to is able to perform a filtering between a first frequency F1 and a second frequency F2, said first frequency being dependent on a cutoff frequency of said load, said second frequency being dependent on the sampling frequency.

13. The device for detecting electrical arcs as claimed in claim 10, wherein the calculation processor is further configured to calculate an envelope of said digitized temporal sub-signal corresponding to a current time window.

* * * * *